(12) United States Patent
Wyse et al.

(10) Patent No.: US 9,059,662 B1
(45) Date of Patent: Jun. 16, 2015

(54) ACTIVE COMBINER

(71) Applicants: Russell D. Wyse, Center Point, IA (US); Michael L. Hageman, Mount Vernon, IA (US)

(72) Inventors: Russell D. Wyse, Center Point, IA (US); Michael L. Hageman, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 14/224,867

(22) Filed: Mar. 25, 2014

(51) Int. Cl.
*G06G 7/12* (2006.01)
*H03D 7/14* (2006.01)

(52) U.S. Cl.
CPC .................................. *H03D 7/1491* (2013.01)

(58) Field of Classification Search
CPC .................................................... H03D 7/1441
USPC ........................................................ 327/355
See application file for complete search history.

(56) References Cited

U.S. PATENT DOCUMENTS 7,881,681 B2 * 2/2011 Kuo et al. .................. 455/115.1

OTHER PUBLICATIONS

U.S. Appl. No. 13/438,544, filed Apr. 3, 2012 "Frequency Enhanced Amplifier and Mixer".
U.S. Appl. No. 61/789,902, filed Mar. 15, 2013 "RF Amplifier".

* cited by examiner

*Primary Examiner* — Daniel Rojas
(74) *Attorney, Agent, or Firm* — Angel N. Gerdzhikov; Donna P. Suchy; Daniel M. Barbieri

(57) ABSTRACT

An active combiner can have multiple output sections each with a corresponding input section or a single output section with multiple input sections. The output section can switch between mixer and amplifier modes, with or without variable gain, to modify an input signal from the input section. The input section has a sufficiently high impedance to substantially block the RF signal from other input sections from entering any of the other input sections. The output section has a sufficiently low impedance to receive the RF signal from the input sections.

18 Claims, 5 Drawing Sheets

ACTIVE COMBINER

This application incorporates by reference U.S. patent application Ser. No. 13/438,544 titled, "Frequency Enhanced Amplifier and Mixer" filed Apr. 3, 2012, and U.S. Pat. App. No. 61/789,902 titled, "RF Amplifier" filed Mar. 15, 2013, the contents of both of which are hereby incorporated by reference herein.

BACKGROUND

This invention relates to radio communications, and more specifically to a radio frequency (RF) circuit reconfigurable between an RF mixer with fixed gain, RF mixer with variable gain, an RF amplifier with fixed gain, an RF amplifier with variable gain, and the ability to selectively switch, isolate and/or combine multiple RF signal paths together.

Radio frequency (RF) communications equipment generally employs a combination of mixers, amplifiers and switches to route signals through alternate paths for filtering or processing. Amplifiers are useful to increase the power level of a signal of interest. In RF transmission, RF mixers are used to transpose radio frequencies to a useful signal for transmission and delivery at an intermediate frequency. Conversely, in reception, mixers are used to transpose the RF frequency of a received signal to a relatively low intermediate frequency for processing by downstream electronic circuits. Switches are useful for selectively choosing different signal paths through a system cascade to allow flexibility in filtering, gain shaping, and/or processing of information as desired by the designer.

SUMMARY

An active combiner is disclosed that can switch its output section between mixer and amplifier modes, with or without variable gain, to create a variable gain amplifier or a variable gain mixer. The active combiner includes an input section connected to the output section, which is controlled by a bias section. The output section includes a first base-coupled transistor pair adapted to receive an input signal at emitters of the first base-coupled transistor pair, receive a bias signal at bases of the first base-coupled transistor pair, and provide an output signal at collectors of the first base-coupled transistor pair.

The active combiner can have multiple output sections each with a corresponding input section or a single output section with multiple input sections. With multiple input sections, additional biasing current from DC sources can supply the needed bias current for these stages without over biasing output section. Each input section has a sufficiently high impedance to substantially block an RF signal from any of the input sections from entering the output of any of the input sections. The output section has a sufficiently low impedance to receive the RF signal from the input sections.

These and other aspects, features, and advantages of the invention will become apparent upon review of the following description taken in connection with the accompanying drawings. The invention, though, is pointed out with particularity by the appended claims.

DESCRIPTION OF ILLUSTRATIVE EMBODIMENTS

Radio frequency (RF) communications equipment generally employs a combination of mixers, amplifiers and switches. Mixers are used for up-converting an intermediate frequency (IF) signal to a high-frequency signal or down-converting a high-frequency signal to an IF signal and may be used in both frequency conversion and frequency synthesis applications. Amplifiers are often used for converting a low-power RF signal to a larger signal or converting a larger signal to a low-power RF signal, the latter also being referred to as an attenuator. Switches are used to route signals through alternate paths for filtering or processing. Combiners are used to combine multiple signals into a single signal.

Amplifiers and mixers are constructed with a combination of discrete components, including transistors. Transistors can be made using various fabrication technologies, such as silicon (SI) substrate, silicon-germanium (Si—Ge) substrate, gallium-arsenide (GaAs) substrate, or gallium-nitride (GaN) on a silicon substrate. Various types of transistors are available, including but not limited to a bipolar terminal transistor (BJT), metallic oxide semiconductor (MOS), complementary metallic oxide semiconductor (CMOS), a bipolar CMOS (Bi-CMOS), heterojunction bipolar transistor (HBT), metal semiconductor field effect transistor (MES-FET) and high electron mobility transistor (HEMT). The described embodiment of the present invention is implemented as an HBT-based integrated circuit (IC); however, any of the foregoing fabrication technologies or transistor types can be employed, as can others.

Figure 1:
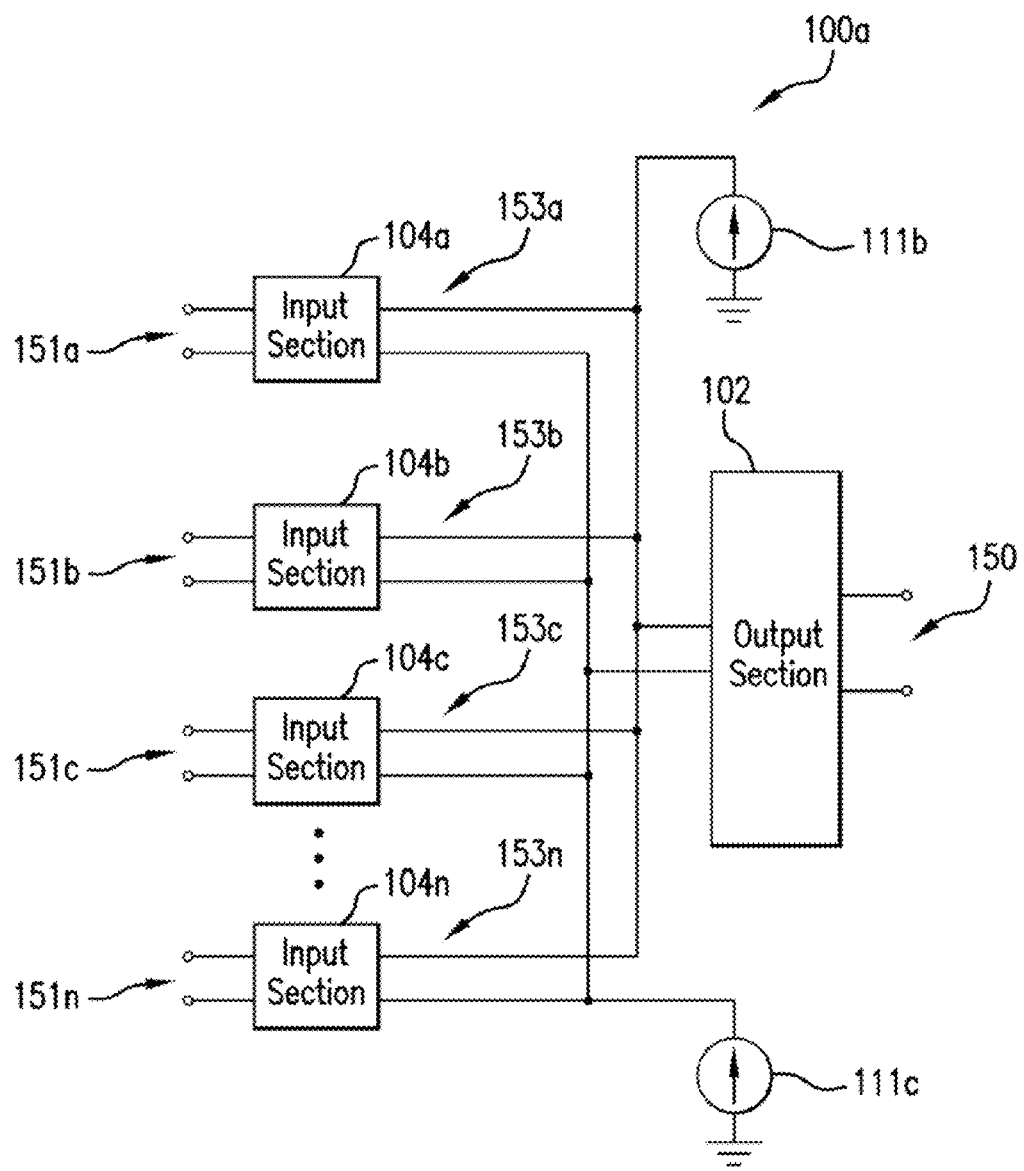
FIG. 1 is a block diagram of an active combiner with a single output section driven by multiple input sections in accordance with an embodiment of the present invention.

FIG. 1 shows an active combiner 100a with a single output section 102 driven by multiple input sections 104a-n in accordance with one embodiment of the present invention. Radio frequency (RF) input signals 151a-n are provided to each input section 104a-n, respectively. These can be any combination of the same or different input signals 151a-n. Each input section 104a-n modifies input signal 151a-n to provide outputs of input section 104a-n that are independent modified signals 153a-n for output section 102. Output section 102 further modifies and combines modified signals 153a-n to provide a combined signal as output signal 150.

Output section 102 can be programmed to switch between at least two modes of operation, including mixer mode and amplifier mode, with or without variable gain to create a variable gain amplifier in a variable gain amplifier mode or a variable gain mixer in a variable gain mixer mode, and across a wide range of bias to provide output signal 150. Because the modes of operation are changed by varying bias signals, as discussed more thoroughly below, active combiner 100a can be reconfigured between each mode of operation without the need for physical or logical switches, although such switches can be used, or without other physical changes to the circuits.

Figure 2:
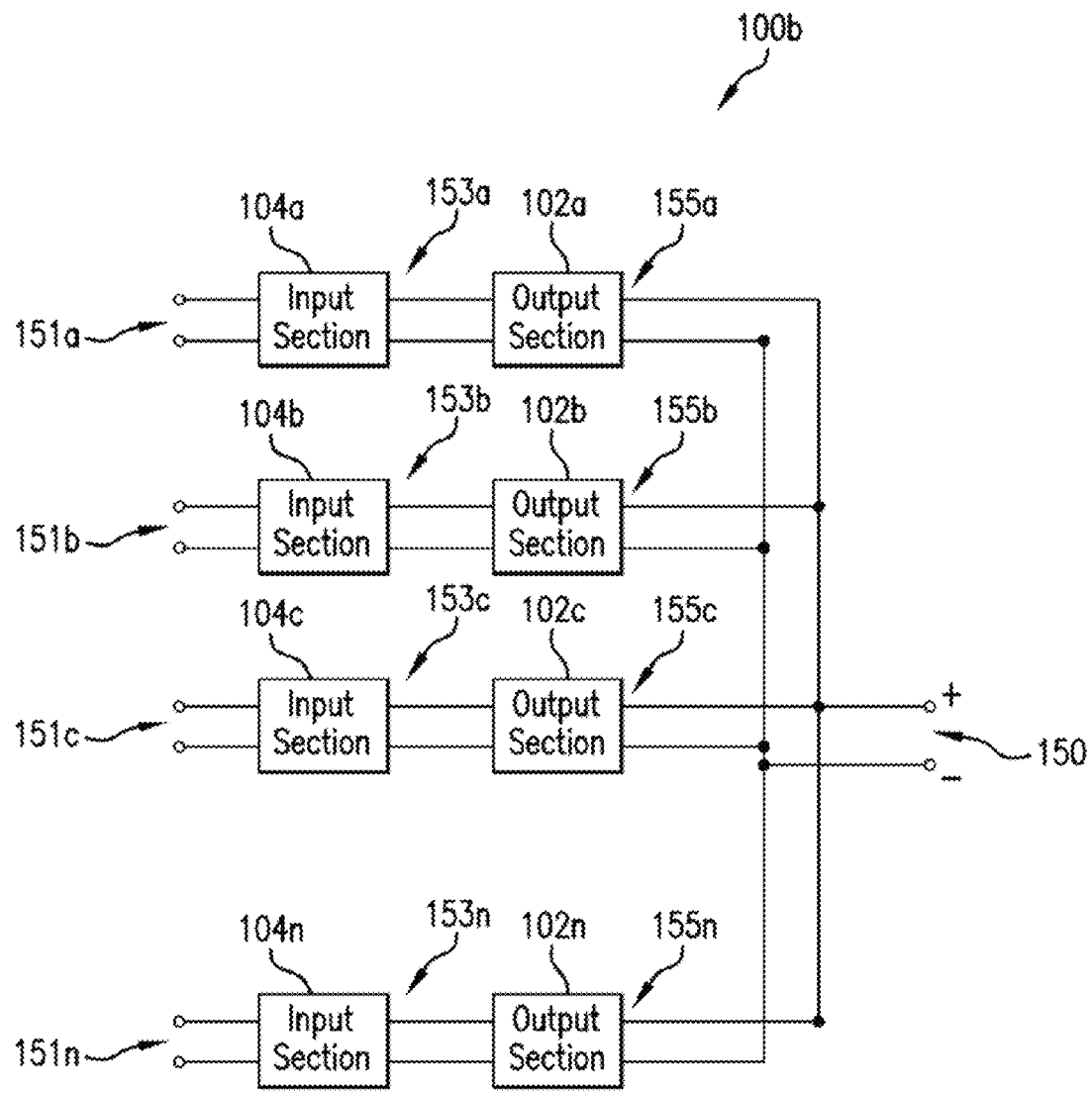
FIG. 2 is a block diagram of an active combiner with multiple output sections each being driven by an input section in accordance with another embodiment of the present invention.

FIG. 2 shows another embodiment for an active combiner 100b with multiple output sections 102a-n each being driven by a corresponding input section 104a-n. Similar to active combiner 100a, input signals 151a-n are provided to each input section 104a-n, respectively. Each input section 104a-n modifies the corresponding input signal 151a-n to provide independent modified signals 153a-n to corresponding output sections 102a-n. Each output section 102a-n further modifies the signal to provide output signals 155a-n that are superimposed with each other to provide a combined signal as output signal 150.

Each output section 102a-n in active combiner 100b operates in a manner similar to the single output section 102 of active combiner 100a. However, active combiner 100b is more flexible than active combiner 100a. Each output section 102a-n can be individually programmed as a mixer or amplifier, with or without variable gain, which allows for a virtually infinite variety of signal modification techniques to be implemented in active combiner 100b.

The multiplication of output sections 102a-n in active combiner 100b, however, increases the parasitic capacitance found at the output of active combiner 100b. Each output section 102a-n has a small amount of parasitic capacitance at its output. The parasitic capacitances of each output section 102a-n sum together to decrease the available bandwidth of active combiner 100b. Each active combiner 100a,b has advantages and disadvantages, but together give the designer a wide variety of options to choose from to meet gain, bandwidth, and power requirements for a given system.

From this point in the present description, active combiner 100 refers to both implementations of active combiners 100a and 100b, while a specific reference to one of active combiners 100a or 100b will be so referenced. Similarly, each input section 104a-n and output section 102a-n, in active combiner 100b, may be collectively referenced as input section 104 and output section 102.

Figure 6:
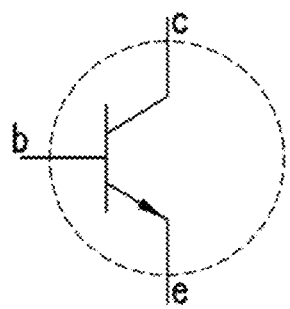
FIG. 6 is a symbol for a bipolar junction transistor found in the active combiners of FIGS. 1 and 2, and the Ft doubler of FIG. 5.

Output section 102 and input section 104 can be implemented with bipolar transistor technology. FIG. 6 shows a bipolar typical transistor with a collector "c", a base "b", and an emitter "e" that can be used in an embodiment of the present disclosure.

Figure 3:
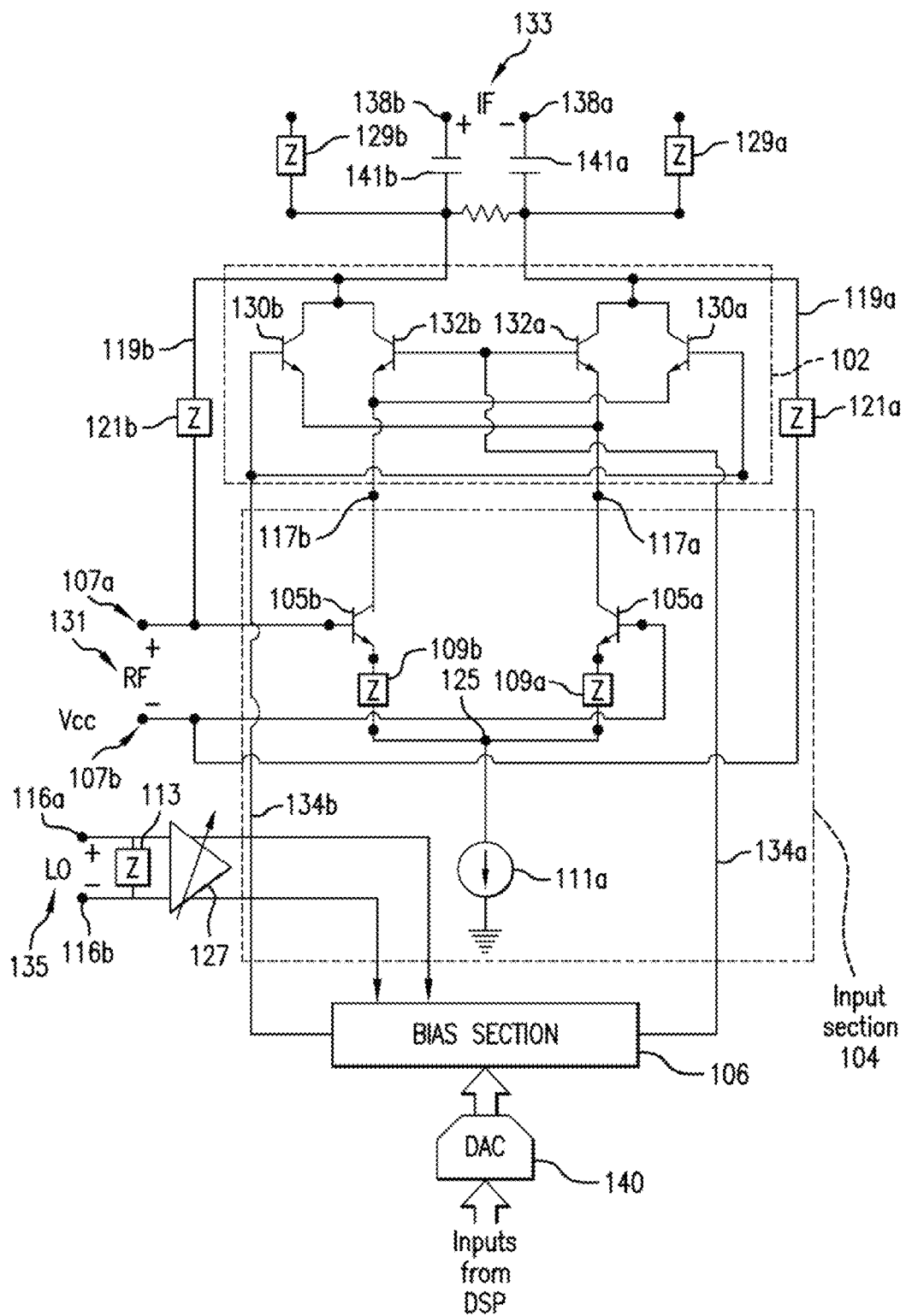
FIG. 3 is a schematic diagram of a multi-mode circuit in accordance with the present invention.

FIG. 3 shows input section 104 connected to output section 102, which is controlled by a bias section 106. Bias section 106 switches output section 102 between its various modes of operation, and provides the LO drive when output section 102 is in mixer mode. Output section 102 can be changed between each mode of operation by varying bias signals to two base-coupled transistor pairs 130a,b and 132a,b of output section 102 and turning on and off a local oscillator (LO) signal 135.

Two-stage amplification of an input signal 131 to input section 104 is provided by cascode-coupling input section 104 and output section 102. Input section 104 includes two transistors 105a,b configured as a differential transistor pair. The two transistors 105a,b receive an input signal 131, which is a differential RF input signal 131, from differential input ports 107a,b connected respectively to the bases of transistors 105a,b. Transistors 105a,b provide a first stage output signal at the collectors, which are connected respectively to nodes 117a,b, which is an output of input section 104. The emitters of differential transistor pair 105a,b are coupled to a common node 125 through respective impedances 109a,b, which is connected to a DC current source 111a.

The second stage of amplification of input signal 131, the output stage, receives the first stage output signal at nodes 117a,b and provides a second stage output signal 133 at output ports 138a,b of output section 102. Output section 102 includes four transistors 130a,b and 132a,b with the bases of each pair AC and DC coupled to bias section 106. Output section 102 is DC coupled to a DC voltage source through chokes 129a,b and output signal passes through DC blocking capacitors 141a,b. Cascode-coupling of two amplification stages provides a wide bandwidth, high gain, and better controlled input impedance.

A negative feedback loop can be provided between output ports 138a,b of output section 102 and the input ports 107a,b of input section 104. Each of the two negative feedback paths 119a,b provides an RF feedback signal from output ports 138a,b to differential input ports 107a,b, respectively, through a corresponding impedance 121a,b. Current source 111a of input section 104 sets the linearity control and maximum current available to the two transistors 105a,b.

Figure 4:
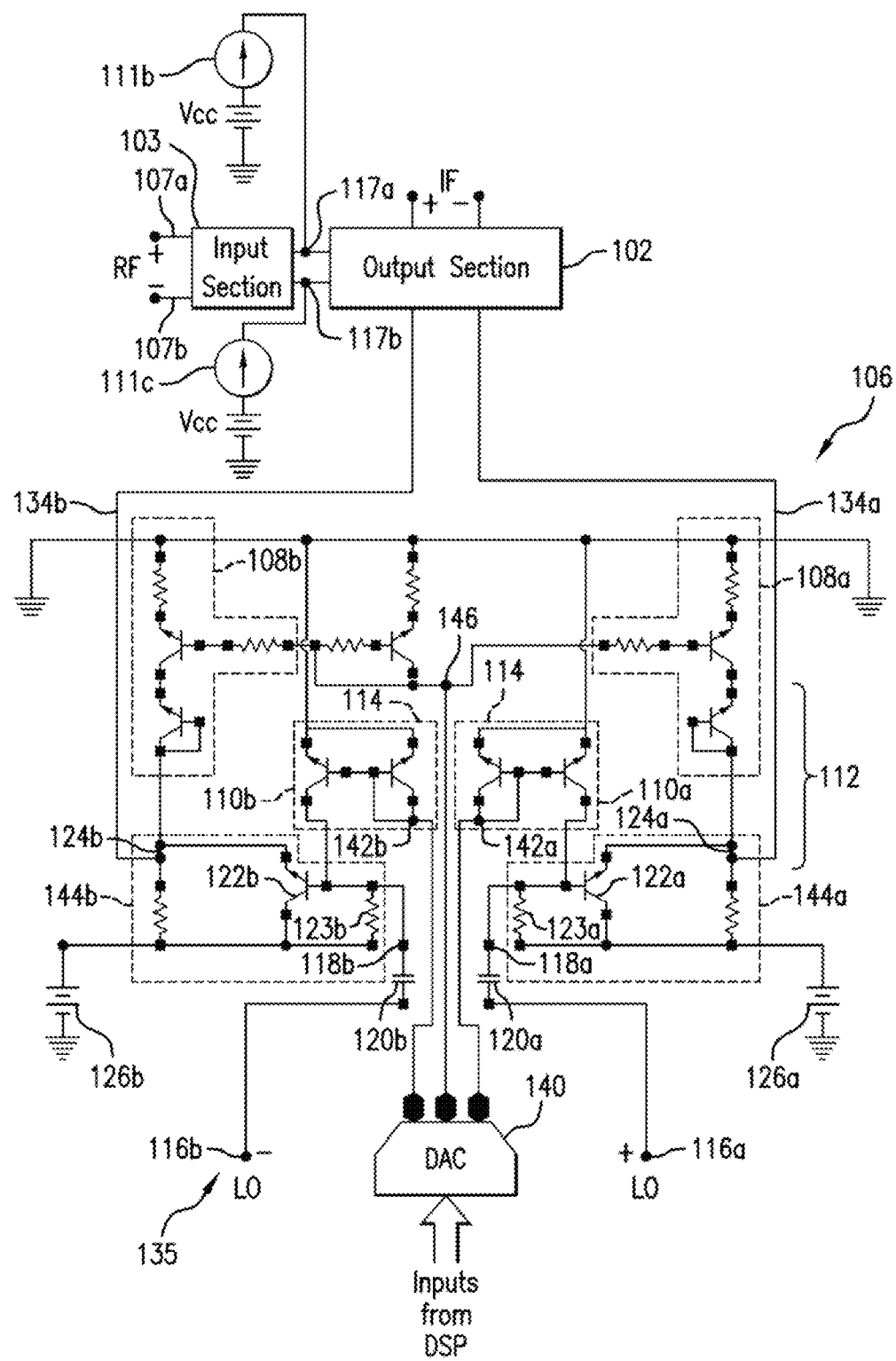
FIG. 4 is a schematic diagram of the bias section of the multi-mode circuit of FIG. 1A.

FIG. 4 shows bias section 106, which generally includes a pair of buffers 144a,b, a pair of first current mirrors 110a,b, and a pair of second current mirrors 108a,b. Each buffer 144a,b, second current mirror 108a,b, and first current mirror 110a,b of the respective pair operate in a similar manner and correspond with each polarity of a differential LO signal 135 at differential bias section input ports 116a,b. More broadly, bias section 106 comprises a first tuner 112, which includes buffers 144 and second current mirrors 108, and a second tuner 114, which includes first current mirrors 110. Current mirrors 108 and 110 receive a control signal from a digital to analog controller (DAC) 140 and mirror and amplify the control signal to the other side of the circuit to isolate DAC 140 from bias section 106; for example, the analog control signal from DAC 140 can range from 0-256 micro-amps and current mirrors 108 and 110 can step up the control signal to a higher range, such as 0-25 mA, 0-80 mA, 0-2 mA, etc.

Buffers 144a,b are connected to the differential bias section input ports 116a,b through corresponding capacitors 120a,b at nodes 118a,b, respectively. Capacitors 120a,b block any direct current (DC) from bias section 106 from leaking into the source of LO signal 135. Buffers 144a,b include common collector transistors 122a,b with the bases connected respectively to nodes 118a,b and the emitters connected respectively to nodes 124a,b. A resistor 123a,b, in each buffer 144a,b, respectively, provides a voltage drop between the bases of transistors 122a,b, respectively, and a voltage source 126a,b connected to each buffer 144a,b, respectively, based on the current from current mirror 110a,b, respectively. Nodes 124a,b of buffers 144a,b are connected to the bases of transistor pairs 130a,b and 132a,b of output section 102 by paths 134a,b, respectively. Paths 134a,b carry the DC bias signal from buffers 144a,b, respectively, for controlling the current in output section 102, as well as provide a path for any LO signal 135 that may be provided depending on desired mode of operation.

The output of buffers 144a,b provide a bias signal on paths 134a,b, respectively, to output section 102 to switch output section 102 between its various modes of operation and gain settings.

FIG. 3 shows output section 102. Transistors 130a,b and 132a,b of output section 102 are connected as two base-coupled transistor pairs 130a,b and 132a,b. Nodes 124a,b of buffers 144a,b are connected to respective base-coupled transistor pairs 130a,b and 132a,b by paths 134a,b, respectively. This enables buffers 144a,b to set the voltage on each of the bases of base-coupled transistor pairs 130a,b and 132a,b. Because the base-coupled transistor pairs 130a,b and 132a,b have their respective bases coupled, the voltage on base of transistor 130a will equal the voltage on the base of transistor 130b, and the voltage on the base of transistor 132a will equal the voltage on the base of transistor 132b.

The voltages on the bases of base-coupled transistor pairs 130a,b, however, can change relative to the voltages on the bases of base-coupled transistor pairs 132a,b to direct the bias current from current source 111a between two base-coupled transistor pairs 130a,b and 132a,b. In effect, bias section 106 steers the bias current from current source 111a, between two base-coupled transistor pairs 130a,b and 132a,b of output section 102 to control the gain by controlling the in-phase transconductance with respect to the out-of-phase transconductance of the two base-coupled transistor pairs 130a,b and 132a,b to increase or decrease the signal cancellation at output ports 138a,b of output section 102.

In active combiner 100a, a single output section 102 is driven by multiple input sections 104a-n. The multiple input sections 104a-n could have a negative impact on the optimum active bias state of transistor pairs 130a,b and 132a,b in output section 102 if multiple sections are turned on at once due to requiring more bias current than output section 102 can provide and still maintain optimum active operation. In order to maintain the desired active bias state of transistor pairs 130a,b and 132a,b, extra DC biasing current from current sources 111b,c can be provided to supply the extra biasing current needed for additional input sections 104a-n. Current sources 111b,c can be controlled by the settings of DAC 140 to adjust the desired bias current as needed for input sections 104a-n to maintain the active biasing state of transistor pairs 130a,b and 132a,b.

A forward active bias state of transistors 105a,b in inputs sections 104a-n is set by a biasing current from DC current sources 111a,b,c, and the RF current from inputs sections 104a-n is steered to output section 102 by the relatively high impedance of the transistors 105a,b in input sections 104a-n compared to the relatively low impedance at the emitters of transistors 130a,b and 132a,b in output section 102. The output impedance of current sources 111b,c is also much higher than the input impedance of output section 102. The current from current source 111a is balanced with the current from sources 111b,c. This forces the RF output currents in the RF signal from the collectors of transistors 105a,b in each input section 105a,b to flow into the low impedance of the emitters of transistors 130a,b and 132a,b of output section 102. The impedance at the emitters of transistors 130a,b and 132a,b of output section 102 is sufficiently low relative to the other potential paths that the RF current from the other input sections 104a-n flows into the low impedance emitter connections of transistors 130a,b and 132a,b of the output section 102. The impedance at the input to output section 102, i.e. the emitters of transistors 130a,b and 132a,b, is 1/gm, where gm is approximate to the current at the collectors ($I_c$) of transistors 130a,b and 132a,b in output section 104 divided by the thermal voltage ($V_t$). In this regard, "high impedance" and "low impedance" are relative terms dependent upon the bias condition, transistor technology and the operating frequency. The relative values are sufficiently high and low enough to steer RF current from all input sections 104a-n into the input of output section 102.

In active combiners 100, output section 102 is switched between mixer-mode and amplifier-mode by modifying the bias voltage in common collector transistors 122a,b in buffers 144a,b and applying an LO signal 135 at input ports 116a,b. As shown in FIG. 3, a variable gain amplifier (VGA) buffer 127 can be combined between input ports 116a,b and bias section 106, and turned on or off, or to couple or isolate LO signal 135 from bias section 106. As shown in FIG. 4, when common collector transistors 122a,b of buffers 144a,b, respectively, are biased on, buffers 144a,b are AC coupled with LO signal 135 through bases of base-coupled transistor pairs 130a,b and 132a,b, respectively. The alternating current of LO signal 135 causes base-coupled transistor pairs 130a,b and 132a,b to switch on and off, which mixes LO signal 135 with input signal 131 received at input section 104 to provide a mixed second stage output signal 133 at output ports 138a,b of output section 102.

Bias section 106 can also modify the gain of output section 102 in mixer and amplifier modes. Second tuner 114 can work with current mirrors 108a,b of first tuner 112 to precisely control the DC voltage levels at nodes 124a,b, of buffers 144a,b, respectively, and maintain a voltage drop across resistors 123a,b, respectively, for precise control over the transconductance of output section 102. First current mirrors 110a,b of second tuner 114 adjust independently the DC voltage at the emitters of common collector transistors 122a,b of buffers 144a,b. By adjusting the relative offset between base-coupled transistor pairs 130a,b and 132a,b, the transconductance of first base-coupled transistor pair 130a,b relative to the second transconductance of base-coupled transistor pair 132a,b can be controlled by regulating the amount of bias current from current sources 111a,b,c that flows through base-coupled transistor pairs 130a,b and 132a,b. For example, if node 124a of buffer 144a is set 0.1V DC higher than node 124b of buffer 144b by using first current mirrors 110 to adjust the DC voltage at the bases of common collector transistors 122a,b of buffers 144a,b, then the voltage on the bases of first base-coupled transistor pair 132a,b will be higher than the voltage on the bases of base-coupled transistor pair 130a,b. More current will then flow though base-coupled transistor pairs 132a,b than base-coupled transistor pairs 130a,b. The transconductance of first base-coupled transistor pair 132a,b will be higher than the transconductance of the second base-coupled transistor pair 130a,b. The gain is linearly adjusted up and down by raising and lowering the transconductance of base-coupled transistors pairs 130a,b and 132a,b with respect to each other. In active combiner 100b, which has multiple output sections 102a-n, adjusting the relative offset between base-coupled transistor pairs 130a,b and 132a,b determines which output sections 102a-n are forward active and what their respective gains are. This allows each output section 102a-n to be independently controlled.

In mixer mode, output section 102 operates with the maximum amount of gain when the transconductance of base-coupled transistor pairs 130a,b and 132a,b are equal. Conversely, in amplifier mode, output section 102 operates with the maximum amount of gain when of one of base-coupled transistor pairs 130a,b and 132a,b is receiving all of the current from current source 111a and the other one of base-coupled transistor pairs 130a,b and 132a,b is off. Furthermore, by varying the bias between base-coupled transistor pairs 130a,b and 132a,b relative to each other the phase of the gain from each base-coupled transistor pairs 130a,b and 132a,b can be moved 180 degrees with respect to each other.

Base-coupled transistor pairs 130a,b and 132a,b in output section 102 is referred to as a "quad-core." A quad-core enables output section 102 to be configured with variable gain. In an alternative implementation where variable gain capability is not required, the quad-core can be replaced with a "dual-core" output section 102 with a single base-coupled transistor pair 132a,b, which will extend the available bandwidth by reducing the parasitic capacitance found at the output of output section 102.

DAC 140 converts command signals received from a digital signal processor (DSP) to analog signals. These analog signals are used to adjust the outputs of current sources 111a, b,c, first current mirrors 110, and second current mirrors 108.

First current mirrors 110a, b receive an analog input or bias signal from DAC 140 at ports 142,a,b, respectively. The bias signal to each of first current mirrors 110a,b can be varied relative to each other to adjust the DC voltage at the emitters of common collector transistors 122a,b of buffers 144a,b with respect to each other, as discussed above.

DAC 140 also provides a common analog input or bias signal to second current mirrors 108 at port 146. Second current mirrors 108 can also be used to control which output section 102 is on or off by setting the DC voltage level of buffers 144, as well as the transconductance, transition frequency (ft) and other RF characteristics of output section 102. When biasing output section 102 in active combiner 100a off, the gain is reduced to zero. When biasing output sections 102a-n in active combiner 100b off, bias current from current source 111a is turned off. DAC 140 can also increase signal and frequency handling capabilities of common collector transistors 122a,b to properly drive LO signal 135 across a wide frequency and signal level range by increasing the bias signal to second current mirrors 108. To conserve power, DAC 140 can lower the bias signal to second current mirrors 108 when output section 102 is not in mixer mode, but still provide enough DC current capability to supply the bias signal to output section 102.

Output section 102 is in mixer-mode when buffers 144 are biased on with sufficient bias current to raise the transconductance and Ft enough to move base-coupled transistor pairs 130a,b and 132a,b to a point within their operating range so that the output current of base-coupled transistor pairs 130a,b and 132a,b can increase and decrease (or turn on and off) without distortion as the input signal (LO signal 135) to base-coupled transistor pairs 130a,b and 132a,b swings through a complete AC cycle, and when output section 102 is AC coupled to LO signal 135. In mixer-mode, output section 102 operates at full gain when the voltages at the bases of base-coupled transistor pairs 130a,b 132a,b are balanced or equal. Output section 102 operates at minimum gain when base-coupled transistor pair 132a,b receives a maximum bias voltage and base-coupled transistor pair 130a,b receives no bias voltage, or vice versa provided impedances 121a,b are high enough to prevent positive feedback. Varying the bias voltages with respect to each base-coupled transistor pair 130a,b and 132a,b can modify the gain of output section to any range between maximum and substantially complete signal isolation.

Conversely, in amplifier-mode, output section 102 operates at full gain when second base-coupled transistor pair 132a,b receives a maximum bias voltage and first base-coupled transistor pair 130a,b receives no bias voltage, or vice versa provided impedances 121a,b are high enough to prevent positive feedback. Output section 102 operates at minimum gain (or substantially complete signal isolation) when the voltages at the bases of base-coupled transistor pairs 130a,b 132a,b are balanced or equal. Varying the bias voltages with respect to each base-coupled transistor pair 130a,b and 132a,b can modify the gain of output section to any range between maximum gain and substantially complete signal isolation.

Figure 5:
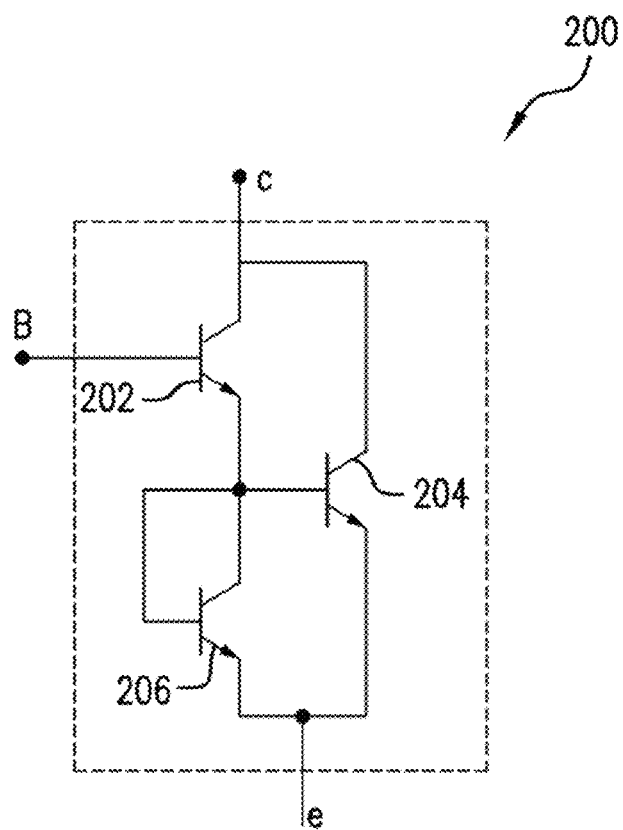
FIG. 5 is a schematic diagram of a Ft doubler suitable for an embodiment of the present invention.

The frequency bandwidth of input section 104 and output section 102 can be nearly doubled by replacing each transistor in base-coupled transistor pairs 130a,b, 132a,b, and 105a,b with an Ft doubler 200, shown in FIG. 5. Ft doubler 200 includes a transistor 202 Darlington-connected with a transistor 204. A transistor 206 is diode-connected in parallel between the base and the emitter of transistor 204. Ft doubler 200 can be treated as a single transistor unit super-cell with a base, collector, and emitter like the transistor shown in FIG. 6. Ft doubler 200 nearly doubles the unity-gain frequency of a given transistor topology and raise the impedance at the base of transistor 202, which extends the useable frequency of operation and the level of power saturation where acceptable input impedance is maintained for high-frequency operation, and significantly increases the maximum RF gain per stage for a given transistor technology. More information about the operation of the Ft doublers can be found in U.S. patent application Ser. No. 13/438,544 filed Apr. 3, 2012 and U.S. Pat. App. No. 61/789,902 filed Mar. 15, 2013, the contents of which are hereby incorporated by reference herein.

The devices of the present disclosure can be implemented as a single electrical circuit or unit cell that is reconfigurable to an amplifier or a mixer, with variable gain and variable linearity control and switchable combining or modification of an RF signal.

While the present invention has been particularly shown and described with reference to exemplary embodiments thereof, it should be understood by those of ordinary skill in the art that various changes, substitutions and alterations can be made herein without departing from the scope of the invention as defined by the appended claims and their equivalents.

What is claimed is:

1. An active combiner comprising:
    an output section for modifying an input signal and providing an output signal;
    a bias section connected to the output section for providing a bias signal to the output section for switching the output section between an amplifier mode and a variable gain amplifier mode; and
    an input section for providing the input signal, wherein the output section further comprises a first base-coupled transistor pair adapted to receive the input signal at emitters of the first base-coupled transistor pair, receive a bias signal at bases of the first base-coupled transistor pair, and provide the output signal at collectors of the first base-coupled transistor pair, wherein a first tuner directs the bias signal between the first base-coupled transistor pair to modify a transconductance of the bases of the first base-coupled transistor pair, and wherein the output section further comprises a second base-coupled transistor pair that is adapted to receive the input signal at emitters of the second base-coupled transistor pair, receive a bias signal at bases of the second base-coupled transistor pair, and provide the output signal at collectors of the second base-coupled transistor pair.

2. The active combiner of claim 1, wherein the bias signal further switches the output section to a mixer-mode.

3. The active combiner of claim 2, wherein the bias section further comprises a first tuner that directs the bias signal to the output section to switch the output section between the mixer mode and the amplifier mode.

4. The active combiner of claim 1, and further comprising a plurality of input sections providing a plurality of input signals that are superimposed and provided to output section to provide an output signal.

5. The active combiner of claim 4, and further comprising a DC current source combined to an output of the plurality of input sections for providing a biasing current to the plurality of input sections, wherein the input signal from each of the plurality of input sections are radio frequency (RF) input signals, and wherein the output of the plurality of input sections has sufficiently high impedance to substantially block the RF input signal from the other of the plurality of input sections from entering any of the plurality of input sections and the output section has a sufficiently low impedance to receive the RF input signal from each of the plurality of input sections.

6. The active combiner of claim 1, and further comprising a plurality of output sections providing a plurality of output signals and superimposing the plurality of output signals for providing an output signal.

7. The active combiner of claim 6, and further comprising a plurality of input sections, wherein each of the plurality of input sections provides an input signal to one of the plurality of output sections.

8. An active combiner comprising:
   an output section for modifying an input signal and providing an output signal;
   a bias section connected to the output section for providing a bias signal to the output section for switching the output section between an amplifier mode and a variable gain amplifier mode; and
   an input section for providing the input signal, wherein the bias signal further switches the output section to a mixer mode, wherein the bias section further comprises a first tuner that directs the bias signal to the output section to switch the output section between the mixer mode and the amplifier mode, wherein the first tuner further comprises a buffer connected to a second current mirror, wherein the buffer provides the bias signal to the output section based on a control signal received by the second current mirror.

9. An active combiner comprising:
   an output section having an input for modifying an input signal and providing an output signal;
   a bias section connected to the output section for providing a bias signal to the output section for switching the output section between at least two modes of operation;
   an input section with an output for providing the input signal; and
   a current source combined to the output of the input section for providing a biasing current to the input section for biasing the input section, wherein the output of input section has a sufficiently high impedance to substantially block the input signal from entering the output of the input section and the output section has a sufficiently low impedance to receive the input signal from the input section.

10. The active combiner of claim 9, wherein the at least two modes of operation are an amplifier modes and a variable gain amplifier mode.

11. The active combiner of claim 9, wherein the at least two modes of operation are a mixer mode and a variable gain mixer mode.

12. The active combiner of claim 9, and further comprising a plurality of input sections providing a plurality of input signals, wherein the output section receives the plurality of input signals that are superimposed to provide the output signal.

13. The active combiner of claim 9, and further comprising a plurality of output sections providing a plurality of output signals and superimposing the plurality of output signals for providing an output signal.

14. The active combiner of claim 13, and further comprising a plurality of input sections, wherein each of the plurality of input sections provides an input signal to one of the plurality of output sections.

15. The active combiner of claim 9 wherein the bias signal further switches the output section between an amplifier mode and a mixer mode, wherein the bias section further comprises a first tuner that directs the bias signal to the output section to switch the output section between the mixer mode and the amplifier mode, wherein the first tuner further comprises a buffer connected to a second current mirror, wherein the buffer provides the bias signal to the output section based on a control signal received by the second current mirror.

16. An active combiner comprising:
   an output section having an input for modifying an input signal and providing an output signal;
   a bias section connected to the output section for providing a bias signal to the output section for switching the output section between at least two modes of operation;
   an input section with an output for providing the input signal; and
   a current source combined to the output of the input section for providing a biasing current to the input section, wherein the output of input section has a sufficiently high impedance to substantially block the input signal from entering the output of the input section and the output section has a sufficiently low impedance to receive the input signal from the input section.

17. The active combiner of claim 16, wherein the at least two modes of operation are chosen from an amplifier mode, a mixer mode, a variable gain amplifier mode, and a variable gain mixer mode.

18. The active combiner of claim 17, wherein the bias signal further switches the output section to a mixer mode, wherein the bias section further comprises a first tuner that directs the bias signal to the output section to switch the output section between the mixer mode and the amplifier mode, wherein the first tuner further comprises a buffer connected to a second current mirror, wherein the buffer provides the bias signal to the output section based on a control signal received by the second current mirror, and wherein the output section further comprises a first base-coupled transistor pair adapted to receive the input signal at emitters of the first base-coupled transistor pair, receive a bias signal at bases of the first base-coupled transistor pair, and provide the output signal at collectors of the first base-coupled transistor pair, wherein a first tuner directs the bias signal between the first base-coupled transistor pair to modify a transconductance of the bases of the first base-coupled transistor pair.

* * * * *